United States Patent [19]

Bobbio

[11] Patent Number: 4,680,087

[45] Date of Patent: Jul. 14, 1987

[54] ETCHING OF DIELECTRIC LAYERS WITH ELECTRONS IN THE PRESENCE OF SULFUR HEXAFLUORIDE

[75] Inventor: Stephen M. Bobbio, Wake Forest, N.C.

[73] Assignee: Allied Corporation, Morris Township, Morris County, N.J.

[21] Appl. No.: 819,651

[22] Filed: Jan. 17, 1986

[51] Int. Cl.$^4$ .................. C03C 15/00; C23F 1/02
[52] U.S. Cl. .................. 156/643; 291/584; 291/590; 156/646; 156/653; 156/656; 156/657; 156/662
[58] Field of Search ............ 156/643, 646, 653, 633, 156/656, 657, 662; 29/584, 590

[56] References Cited

U.S. PATENT DOCUMENTS

| | | | |
|---|---|---|---|
| 3,536,547 | 10/1970 | Schmidt | 156/17 |
| 3,575,733 | 4/1971 | Cecil | 148/1.6 |
| 3,575,745 | 4/1971 | Hill | 156/3 |
| 3,580,749 | 5/1971 | Simon et al. | 148/187 |
| 3,615,935 | 10/1971 | O'Keeffe et al. | 148/187 |
| 4,134,817 | 1/1978 | Bourdon | 204/192 E |
| 4,268,951 | 5/1981 | Elliott et al. | 29/571 |
| 4,330,384 | 5/1982 | Okudaira et al. | 156/643 X |
| 4,377,437 | 3/1983 | Taylor et al. | 156/628 |
| 4,501,061 | 2/1985 | Wonnacott | 156/643 |
| 4,529,476 | 7/1985 | Kawamoto et al. | 156/653 X |
| 4,534,824 | 8/1985 | Chen | 156/628 |

FOREIGN PATENT DOCUMENTS 1485063 2/1975 United Kingdom .

OTHER PUBLICATIONS

Heinecke, et al., Electric Phenomena, 88:98195g, (1978).
Beinvogl, et al., Electric Phenomena, 96:95809g, (1982).

*Primary Examiner*—Robert L. Lindsay
*Attorney, Agent, or Firm*—Harold N. Wells; Jay P. Friedenson; Anthony J. Stewart

[57] ABSTRACT

In the manufacture of semiconductor components, direct etching is effected using electrons. In a specific application an electron beam may be used to directly etch a pattern in a dielectric layer in an atmosphere of low pressure sulfur hexafluoride. The technique involves a simpler alternative to the more typical microcircuit manufacturing processes in which dielectric layers such as silicon dioxide, silicon nitride or silicon oxynitride are etched by either plasma or wet chemical techniques through a photoresist mask. The latter invariably involves a large number of process steps. The disclosed method presents a simpler alternative in which the silicon dioxide, for example, is patterned directly and which may be particularly suited to very small (sub-micron) geometries or to more conventional geometries if a high intensity electron flood exposure system is used.

8 Claims, No Drawings

ETCHING OF DIELECTRIC LAYERS WITH ELECTRONS IN THE PRESENCE OF SULFUR HEXAFLUORIDE

DESCRIPTION

The invention relates to pattern etching of semiconductor components by use of electrons and more particularly to the direct etching of dielectric films or layers with electrons in a sulfur hexafluoride environment. In a specific application, the invention relates to etching of dielectric films or layers in the presence of sulfur hexafluoride using an electron beam. A scanned electron beam may be used to etch the pattern in the silicon dioxide layer in an $SF_6$ atmosphere at pressures of the order of $10^{-4}$ to $10^{-2}$ torr.

BACKGROUND OF THE INVENTION

This invention has application in the field of generating selective patterns in a dielectric layer in semiconductor component manufacture. In a typical microcircuit manufacturing process, a dielectric layer such as silicon dioxide, silicon nitride or silicon oxynitride, is etched by use of either plasma or wet chemical etch techniques through a photoresist mask. Such methods invariably involve a large number of process steps. The present invention presents a simpler alternative in which the dielectric layer, e.g. silicon dioxide, for example, is patterned directly. The invention is particularly suited to small geometries using an electron beam or to larger geometries when a high intensity electron flood exposure system is applied.

SUMMARY OF THE INVENTION

Among the objects of the invention, which uses an electron beam in etching, is the provision of a method that permits the use of commercially available electron microscopes to directly etch a pattern in the silicon dioxide semi-conductor layer. This method of etching is distinguished from the more conventional prior art techniques, e.g., plasma etch methods that require a post exposure development step prior to etching.

An electron beam (e-beam), the source of which may conveniently be an electron microscope, for example, may be used to directly etch a pattern in $SiO_2$ in a chamber which contains $SF_6$. A suitable $SF_6$ pressure of the order of $10^{-4}$ to $10^{-2}$ torr. The etching is selective for the silicon dioxide layer, i.e., etching is not observed on silicon under the same conditions.

The invention provides a relatively simple way of realizing sub-micron geometries which are considered necessary for improved miniaturization of semiconductor microcircuitry manufacture by direct etching. In the case of an electron beam generator, the pattern to be etched can be stored on a computer, a photoresist mask is not necessary. However, where a flood source of high intensity is available, a mask would be employed.

DETAILED DESCRIPTION OF THE INVENTION

In accordance with the invention, a simpler alternative to either plasma or wet chemical etching using a photoresist mask (which invariably requires a large number of process steps) is provided. By using an electron beam, and preferably a computer controlled electron beam, in a low pressure $SF_6$ environment to effect the etch operation, the dielectric layer can be patterned directly. The technique of the invention is particularly suited to very small (sub-micron) geometries but it may be applied to more conventional geometries in conjunction with a high intensity electron flood exposure system. The latter would require the use of a mask to provide the desired geometries.

The invention will now be further described by reference to a specific embodiment. It will be understood, however, that details supplied with reference to the particular embodiment given primarily for purposes of illustration, should not be construed to limit the invention in its broader aspects.

A small section of a silicon wafer upon which a thick layer of silicon dioxide had been grown was placed in the sample compartment of a commercial scanning electron microscope (ETEC Autoscan). A focussed beam of 20 keV electrons was rastered over a narrow rectangular area of the section. During the scan, the sample compartment was maintained at a pressure of $7 \times 10^{-4}$ torr of $SF_6$. The section was then removed, coated with 200 Å of gold/palladium using a standard technique for electron beam imaging of insulators, placed once again in the microscope and photographed. A small narrow rectange was visibly seen as having been etched in the oxide by action of the electrons and $SF_6$.

The rate at which the combination ($e^-$ and $SF_6$) attacks the surface may be calculated from the formula:

$$\text{Rate} = \frac{\text{(Volume of oxide removed)}}{\text{(Total time of raster scan)} \times \text{(diameter of } e\text{-beam)}}$$

Based on the assumption that the electron beam diameter is about 200 Å application of the formula results in a rate of about 7700 Å/sec. for oxide removal. When a section of silicon which had not been coated with oxide was used an etch was not observed; this indicates that the process is selective.

It is apparent to those skilled in the art that other dielectric materials such as silicon nitride and silicon oxynitride which are either deposited (e.g., by chemical vapor deposition) or thermally grown, may be employed and exhibit etching characteristics comparable to that shown in silicon dioxide when placed in an environment with $SF_6$ and an e-beam.

While the present invention has been described in a limited illustrative embodiment, it is apparent that various modifications may be made to the essential teaching without departing from the spirit and scope of the invention disclosed.

What is claimed is:

1. In a method of fabricating a semiconductor device wherein a pattern is etched in dielectric film or layer on a silicon substrate, the improvement comprising directing electrons onto the layer in a low pressure sulfur hexafluoride environment to generate a desired pattern in the dielectric layer.

2. The method of claim 1 wherein the dielectric material is silicon dioxide.

3. The method of claim 1 wherein the dielectric material is silicon nitride.

4. The method of claim 1 wherein the dielectric material is silicon oxynitride.

5. The method of claim 1 wherein the electrons are derived in a stream from an electron microscope.

6. The method of claim 1 wherein the pressure of sulfur hexafluoride is of the order of $10^{-4}$ to $10^{-2}$ torr.

7. The method of claim 1 in which the process is selective for the dielectric, layer over the silicon substrate which is not etched.

8. The method of claims 1, 2, 3 or 4 wherein the dielectric layer is deposited by chemical vapor deposition.

* * * * *